United States Patent [19]
Merchant et al.

[11] Patent Number: 5,863,666
[45] Date of Patent: Jan. 26, 1999

[54] HIGH PERFORMANCE FLEXIBLE LAMINATE

[75] Inventors: Harish D. Merchant, Hinckley; Sidney J. Clouser, Chardon, both of Ohio

[73] Assignee: Gould Electronics Inc., Eastlake, Ohio

[21] Appl. No.: 911,357

[22] Filed: Aug. 7, 1997

[51] Int. Cl.$^6$ .............................. B22D 3/00; B41M 5/20
[52] U.S. Cl. ........................ 428/544; 428/209; 428/606; 428/615; 428/344; 205/50; 205/77; 205/148; 205/170
[58] Field of Search .................................. 428/344, 209, 428/544, 615, 606; 205/50, 77, 148, 170

[56] References Cited

U.S. PATENT DOCUMENTS

| | | | |
|---|---|---|---|
| 4,997,722 | 3/1991 | Adler | 428/596 |
| 5,091,251 | 2/1992 | Sakumoto et al. | 428/344 |
| 5,171,417 | 12/1992 | DiFranco et al. | 205/77 |
| 5,215,645 | 6/1993 | DiFranco et al. | 205/77 |
| 5,219,640 | 6/1993 | Gazit et al. | 428/209 |
| 5,403,465 | 4/1995 | Apperson et al. | 205/77 |
| 5,421,985 | 6/1995 | Clouser et al. | 205/77 |
| 5,431,803 | 7/1995 | DiFranco et al. | 205/50 |
| 5,437,914 | 8/1995 | Saida et al. | 428/209 |
| 5,679,444 | 10/1997 | Davis et al. | 428/344 |

FOREIGN PATENT DOCUMENTS

| | | |
|---|---|---|
| 9700338 | 1/1997 | WIPO . |

OTHER PUBLICATIONS

International Search Report for Application No. PCT/US97/13966; Dated Nov. 24, 1997.

L.C. Lim, Acta metall. Mater., vol. 38, No. 4, pp. 595–601, 1990, "Fatigue Damage and Crack Nucleation Mechanisma at Intermediate Strain Amplitudes."

W. Engelmaier et al., Circuit World, vol. 14, No. 2, 1988, "Fatigue Behavior and Ductility Determination for Rolled Annealed Copper Foil and Flex Circuits on Kapton."

W. Engelmaier, Testing of Metallic And Inorganic Coatings, ASTM (1987), pp. 67–95, "Results of the IPC Copper Foil Ductility Round–Robin Study."

D. Avery, Circuit World, vol. 14, No. 2, 1988, "Copper Foil for Flexible Circuits."

W. Engelmaier et al., 21$^{st}$ Annual IPC Meeting, Apr. 1978, "A New Ductility and Flexural Test Method for Copper Foil and Flexible Printing Wiring."

Primary Examiner—William Krynski
Assistant Examiner—Cathy F. Lam
Attorney, Agent, or Firm—Renner, Otto, Boisselle & Sklar, P.L.L.

[57] ABSTRACT

This invention relates to an improved high performance flexible laminate, comprising: a layer of electrodeposited copper foil overlying a layer of a flexible polymeric material, said copper foil being characterized by an ultimate tensile strength at 23° C. of at least about 60,000 psi, a loss of ultimate tensile strength at 23° C. of no more than about 15% after being annealed at 180° C. for 30 minutes, an average grain size of up to about 1 micron, and a fatigue performance characterized by at least about 5000 cycles to failure when the strain amplitude is about 0.05% to about 0.2%. In one embodiment, the copper foil is electrodeposited using an electrolyte solution characterized by a free chloride ion concentration of up to about 4 ppm and an organic additive concentration of at least about 0.3 ppm.

26 Claims, 1 Drawing Sheet

HIGH PERFORMANCE FLEXIBLE LAMINATE

FIELD OF THE INVENTION

This invention relates to high performance flexible laminates and, more particularly, to flexible laminates that are useful in making electrical connectors and flexible circuit boards that are capable of flexing thousands or millions times over the life of the devices with which they are used.

BACKGROUND OF THE INVENTION

Flexible laminates are used in the electronics industry as the base materials for fabricating a wide variety of flexible electronic products including flexible connectors, flexible circuit boards and flex-rigid circuit boards. Flexible connectors, flexible circuit boards and flex-rigid circuit boards are used in notebook computers, printers and hard disc drives, as well as numerous medical devices and consumer products. Flexible laminates are also used for certain advanced applications such as chip-on-flex and fine-line circuit boards. With the electronics industry moving toward thinner, lighter, flexible and more functional products, the demand for flexible laminates continues to increase.

Flexible laminates are used in applications in which the number of flex cycles required varies widely. In some applications, such as a printed circuit board for use in an automobile dashboard, the laminate is flexed one time during installation. In other applications, such as in a camera, the laminate may be flexed a few hundred times during its life. In the applications to which the present invention is directed, the laminate must be capable of withstanding many thousands or even millions of flex cycles without failure. Such applications include flexible connectors for printers, computer disk drives and other high flex uses.

Electrodeposited copper foil has been used for making flexible laminates. However, the electrodeposited copper foil that has been used typically has a fatigue ductility of about 20 to 50% which may be slightly improved if the foil is heat treated. This level of fatigue ductility provides for copper foils that are acceptable for single bends. However, these copper foils have not been found to be suitable for high flex applications, requiring thousands or even millions of flexes during the life of the device with which they are used.

It would be advantageous to provide a high performance flexible laminate that could be used in making electrical connectors and flexible circuit boards that are capable of flexing thousands or millions of times over the life of the devices with which they are used. The present invention provides for such an advantage.

SUMMARY OF THE INVENTION

This invention relates to an improved high performance flexible laminate, comprising: a layer of electrodeposited copper foil overlying a layer of a flexible polymeric material, said copper foil being characterized by an ultimate tensile strength (UTS) at 23° C. of at least about 60,000 psi, a loss in UTS at 23° C. of not more than about 15% after being annealed at 180° C. for 30 minutes, an average grain size of up to about 1 micron, and a fatigue performance characterized by at least about 5000 cycles to failure when the strain amplitude is about 0.05% to about 0.2%. In one embodiment, the copper foil is electrodeposited using an electrolyte solution characterized by a free chloride ion concentration of up to about 4 ppm and an organic additive concentration of at least about 0.3 ppm.

DESCRIPTION OF THE PREFERRED EMBODIMENTS

Figure 1:
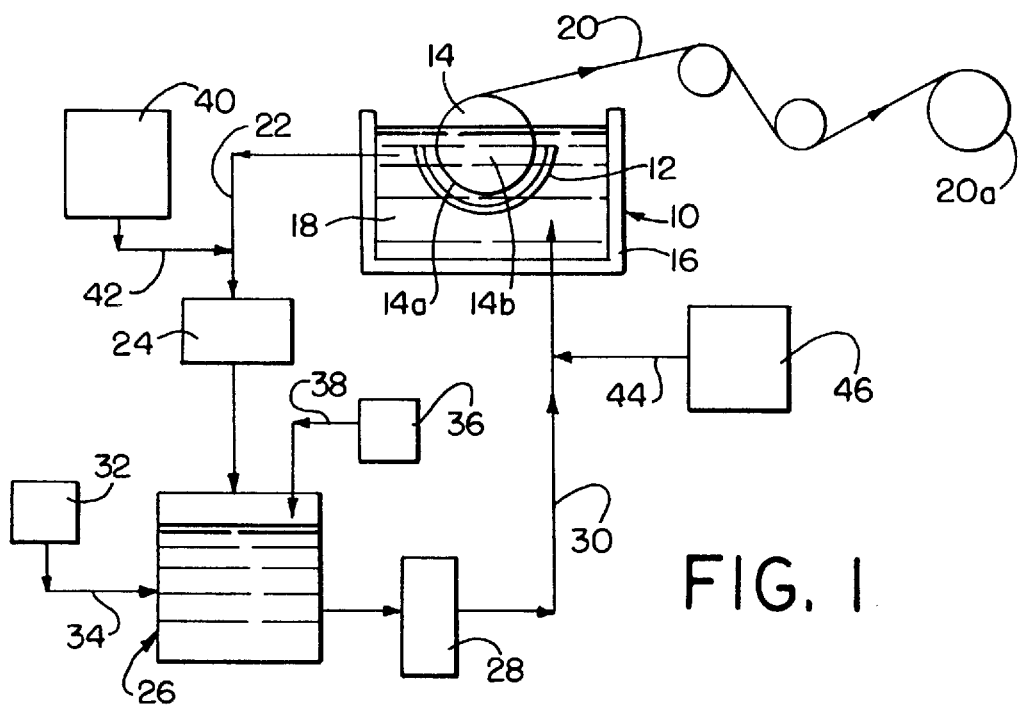
FIG. 1 is a flow sheet illustrating one embodiment of the process for forming the copper foil used in making the inventive laminates.

The copper foil used with the inventive laminate is characterized by a high UTS, thermal stability, (that is, low UTS strength loss following thermal exposure), fine non-columnar grain structure, and a high fatigue cycle life at low strain amplitudes.

The copper foil, as produced, prior to any annealing or heat treating, has a UTS at 23° C. of at least about 60,000 psi, and in one embodiment in the range of about 60,000 psi to about 120,000 psi, and in one embodiment about 65,000 psi to about 110,000 psi, and in one embodiment about 70,000 psi to about 105,000 psi, and in one embodiment about 80,000 to about 105,000 psi, and in one embodiment about 90,000 to about 105,000 psi, using Test Method 2.4.18 of IPC-TM-650. The UTS for these foils at 23° C. following annealing at 180° C. for 30 minutes does not decrease more than about 15% from its initial pre-annealing level, and in one embodiment not more than about 12%, and in one embodiment not more than about 10%, and in one embodiment not more than about 8%, and in one embodiment not more than about 5%.

These foils as produced, prior to any annealing or heat treating, have a fine non-columnar grain structure with an average grain size of up to about 1 micron, and in one embodiment about 0.05 to about 1 micron, and in one embodiment about 0.1 to about 0.8 micron, and in one embodiment about 0.1 to about 0.5 micron, and in one embodiment about 0.1 to about 0.3 micron.

Fatigue performance is measured in terms of number of cycles to failure ($N_f$) when the foil sample is tested in bending, flexing or folding around a given radius. As the bend radius is increased, the strain amplitude ($\Delta\epsilon/2$) per fatigue cycle decreases and $N_f$ increases. The logarithmic relationship between $\Delta\epsilon/2$ and $2N_f$, called the Coffin-Manson plot, is generally linear. The fatigue life, $N_f$, is enhanced as the slope of the $\Delta\epsilon/2$ vs. $2N_f$ plot decreases or as the intercept of the plot at $2N_f=1$ increases. Table 1 relates the diameter of the test mandrel to the approximate strain amplitude, $\Delta\epsilon/2$.

TABLE 1

| FLEX/FOLD FATIGUE | |
|---|---|
| Mandrel Diameter, mils | Approx. Strain Amplitude $\Delta\epsilon/2$ |
| 31 | 2.50 |
| 40 | 2.00 |
| 52 | 1.60 |
| 62 | 1.20 |
| 78 | 0.90 |
| 100 | 0.72 |
| 125 | 0.60 |
| 150 | 0.52 |
| 200 | 0.33 |
| 250 | 0.29 |
| 300 | 0.25 |
| 375 | 0.18 |
| 500 | 0.13 |

TABLE 1-continued

FLEX/FOLD FATIGUE

| Mandrel Diameter, mils | Approx. Strain Amplitude Δε/2 |
|---|---|
| 625 | 0.10 |
| 750 | 0.08 |
| 875 | 0.05 |

For a small bend radius, $\Delta\epsilon/2$ is in the range of 1–5%. For an intermediate bend radius, $\Delta\epsilon/2$ is in the range of 0.2–1%. For a large bend radius, $\Delta\epsilon/2$ is in the range of 0.05–0.2%.

The copper foils used with the present invention are characterized by a high number of fatigue cycles at low strain amplitudes prior to failure. These foils withstand at least about 5000 cycles to failure when the strain amplitude ($\Delta\epsilon/2$) is in the range of about 0.05% to about 0.2%. In one embodiment, these foils withstand at least about 50,000 cycles to failure, and in one embodiment at least about 100,000 cycles, and in one embodiment at least about 500,000 cycles, and in one embodiment at least about $10^6$ cycles, and in one embodiment at least about $10^7$ cycles, and in one embodiment at least about $10^8$ cycles, and in one embodiment at least about $5 \times 10^8$ cycles to failure at a low strain amplitude in the range of about 0.05 to about 0.2%.

The copper foils used with the present invention generally have a matte-side roughness, $R_{tm}$, of about 1 to about 10 microns, and in one embodiment about 2 to about 8 microns, and one embodiment about 3 to about 6 microns. $R_{tm}$ is the mean of the maximum peak-to-valley vertical extent from each of five consecutive sampling lengths, and can be measured using a Surftronic 3 profilometer marketed by Rank Taylor Hobson, Ltd., Leicester, England. The $R_{tm}$ for the shiny side of these foils is generally less than about 6 microns, and in one embodiment less than about 5 microns, and in one embodiment in the range of about 2 to about 6 microns, and in one embodiment in the range of about 2 to about 5 microns.

The weights for these copper foils generally range from about ⅛ to about 14 ounces per square foot, and in one embodiment about ¼ to about 6 ounces per square foot, and in one embodiment about ⅜ to about 6 ounces per square foot, and in one embodiment about ½ to about 2 ounces per square foot. In one embodiment, these foils have weights of about ½, 1 or 2 ounces per square foot. A foil having a weight of ½ ounce per square foot has a nominal thickness of about 17 microns. A foil having a weight of 1 ounce per square foot has a nominal thickness of about 35 microns. A foil having a weight of 2 ounces per square foot has a nominal thickness of about 70 microns. In one embodiment, these foils have a thickness in the range of about 10 to about 250 microns. The $R_{tm}$ for the thinner foils tends to be lower than for the thicker foils. Thus, for example, foils having weights of one-half ounce per square foot have, in one embodiment, a matte side raw foil $R_{tm}$ in the range of about 1 to about 4 microns, while foils having weights of 2 ounces per square foot have, in one embodiment, a matte side raw foil $R_{tm}$ in the range of about 5 to about 7 microns.

The process for making the foils used with this invention involves forming an electrolyte solution, flowing it between the anode and cathode of an electroforming cell, and depositing copper on the cathode. The electrolyte solution is formed by dissolving a copper feed stock, which can be copper shot, scrap copper wire or recycled copper, in a sulfuric acid solution. The copper feedstock, sulfuric acid and water are preferably high purity grade materials. The electrolyte solution can be subjected to a purification or filtering process prior to entering the electroforming cell. When voltage is applied between the anode and cathode, electrodeposition of copper occurs at the cathode. The electric current can be direct current or alternating current with a direct current bias. The electrodeposited copper is removed from the cathode as a continuous thin web of foil as the cathode rotates. It can be collected in roll form. The rotating cathode can be in the form of a cylindrical mandrel. However, alternatively, the cathode can be in the form of a moving belt. Both of these designs are known in the art. In one embodiment, the cathode is stainless steel or a chromium plated stainless steel drum. In one embodiment, the cathode is made of titanium or a titanium alloy. The anode has a curved shape conforming to the curved shape of the cathode to provide a uniform gap between the anode and the cathode. This gap can be from about 0.2 to about 2 centimeters.

The velocity of the flow of the electrolyte solution through the gap between the anode and the cathode is generally in the range of about 0.2 to about 3 meters per second, and in one embodiment about 0.5 to about 2.5 meters per second, and in one embodiment about 0.7 to about 2 meters per second. The electrolyte solution generally has a free sulfuric acid concentration in the range of about 10 to about 150 grams per liter, and in one embodiment about 40 to about 110 grams per liter, and in one embodiment about 50 to about 90 grams per liter. The temperature of the electrolyte solution in the electroforming cell is generally in the range of about 40° C. to about 80° C., and in one embodiment about 45° C. to about 75° C., and in one embodiment about 50° C. to about 70° C. The copper ion concentration (contained in $CuSO_4$) is generally in the range of about 50 to about 130 grams per liter, and in one embodiment from about 65 to about 115 grams per liter, and in one embodiment about 80 to about 100 grams per liter. The current density is in the range of about 500 to about 2000 amps per square foot (ASF), and in one embodiment about 800 to about 2000 ASF, and in one embodiment about 1000 to about 1800 ASF, and in embodiment about 1200 to about 1600 ASF.

The level of undesirable impurities (other than chloride ions) in the electrolyte solution is generally less than about 10 grams per liter, and in one embodiment less than about 5 grams per liter, and in one embodiment less than about 2 grams per liter. These impurities include phosphates, arsenic, zinc, tin, undesirable organic impurities, and the like.

The free chloride ion concentration of the operating electrolyte solution is critical and is preferably zero (or not detectable), but as a practical matter is in the range of up to about 4 ppm, and in one embodiment up to about 3 ppm, and in one embodiment up to about 2 ppm. The chloride ion concentration can be up to about 1 ppm, and in one embodiment up to about 0.8 ppm, and in one embodiment less to about 0.5 ppm, and in one embodiment up to about 0.3 ppm. The term "operating electrolyte solution" is used herein to refer to the electrolyte solution after it enters the operating electroforming cell. A method for measuring low concentrations of chloride ion in the electrolyte solution involves the use of nephelometry and a reagent which forms an insoluble precipitate with chloride ions. Using a nephelometer, the chloride ion content of the electrolyte solution can be quantified at levels as low as about 0.01 ppm.

It is critical that the concentration of organic additives in the electrolyte solution be at least about 0.3 ppm, and in one embodiment in the range of about 0.3 ppm to about 10 ppm, and in one embodiment about 0.5 ppm to about 10 ppm, and in one embodiment, about 1 ppm to about 5 ppm, and in one embodiment from about 2 ppm to about 4 ppm. The organic additives can be one or more gelatins. The gelatins that are useful herein are heterogeneous mixtures of water-soluble proteins derived from collagen. Animal glue is a preferred gelatin. The organic additive can be selected from the group consisting of saccharin, caffeine, molasses, guar gum, gum arabic, thiourea, the polyalkylene glycols (e.g., polyethylene glycol, polypropylene glycol, polyisopropylene glycol, etc.), dithiothreitol, amino acids (e.g., proline, hydroxyproline, cysteine, etc.), acrylamide, sulfopropyl disulfide, tetraethylthiuram disulfide, alkylene oxides (e.g., ethylene oxide, propylene oxide, etc.), the sulfonium alkane sulfonates, thiocarbamoyidisulfide, or derivatives or mixtures of two or more thereof.

In one embodiment of the invention a continuous electrodeposition process for making copper foil is provided. A flow sheet of this process is depicted in FIG. 1. The apparatus used with this process includes an electroforming cell 10 that includes anode 12, cathode 14, vessel 16 and electrolyte solution 18. Anode 12 is submerged in electrolyte solution 18, and cathode 14 is partially submerged in electrolyte solution 18.

Electrical means that are well known in the art are provided for applying a voltage between anode 12 and cathode 14. The current is preferably direct current or alternating current with a direct current bias. Copper ions in solution 18 gain electrons at the peripheral surface 14a of cathode 14 whereby metallic copper plates out in the form of a foil layer 20. Cathode 14 rotates continuously about its axis 14b during the process and foil layer 20 is continuously withdrawn from surface 14a as a continuous web which is formed into a roll 20a.

The process depletes the electrolyte solution of copper ions and organic additives, when such organic additives are used. These ingredients are continuously replenished. Electrolyte solution 18 is withdrawn through line 22 and recirculated through filter 24, digester 26 and filter 28, and then is reintroduced into vessel 16 through line 30. Sulfuric acid from a source 32 is advanced to digester 26 through line 34. Copper from a source 36 is introduced into digester 26 along path 38. In one embodiment the copper is in the form of copper shot, copper wire, copper oxide or recycled copper. The copper is dissolved by the sulfuric acid and air to form copper ions in digester 26. Organic additives are added to the recirculating solution in line 22 from a source 40 through line 42 or through line 44 from a source 46.

A one-half ounce sample of copper foil useful with the invention is produced under the conditions indicated below and has the indicated properties:

| | |
|---|---|
| Chloride ion concentration, ppm | 0.1–0.3 |
| Animal glue concentration, ppm | 2–4 |
| Current Density, ASF | 1200–1600 |
| Strain amplitude Δε/2, % | 0.05–0.2 |
| Number of cycles to failure ($N_f$) | $5 \times 10^5$ to $5 \times 10^7$ |
| UTS at 23° C. prior to annealing, psi | 100,000 |
| UTS at 23° C. after annealing at 180° C. for 30 minutes, psi | 95,000 |
| Average grain size, microns | 0.2 |

The terms "untreated" and "raw" are used herein to refer to a base foil that has not undergone subsequent treatment for the purpose of refining or enhancing the foil properties. The term "treated" is used herein to refer to raw or base foil that has undergone such treatment. This treatment is entirely conventional and typically involves the use of various treating and rinsing solutions. In one embodiment, the raw or base foil has at least one roughened layer of copper applied to one or both sides of the foil.

In one embodiment, the raw or base foil has at least one metallic or barrier layer applied to one or both sides of the foil. The metal in this metallic layer is selected from the group consisting of indium, zinc, tin, nickel, cobalt, copper-zinc mixture or alloy, zinc-nickel mixture or alloy, copper-tin mixture or alloy and combinations thereof. These metallic layers generally have thicknesses in the range of about 0.01 to about 1 micron, and in one embodiment about 0.05 to about 0.1 micron.

In one embodiment, the raw or base foil has at least one metallic or stabilization layer applied to one or both sides of the foil. The metal in this metallic layer is selected from the group consisting of tin, chromium, chromium-zinc mixture or alloy, zinc-nickel mixture or alloy and combinations thereof. These metallic layers generally have thicknesses in the range of about 0.005 to about 0.05 micron, and in one embodiment about 0.01 to about 0.02 micron. In one embodiment, the raw or base foil has at least one first metallic or barrier layer applied to one or both sides of the foil, the metal in the first metallic layer being selected from the group consisting of indium, zinc, tin, nickel, cobalt, copper-zinc mixture or alloy and copper-tin mixture or alloy, and at least one second metallic or stabilization layer applied to the first metallic layer, the metal in the second metallic layer being selected from the group consisting of tin, chromium, and chromium-zinc mixture or alloy.

In one embodiment, the raw or base foil has at least one roughened layer of copper applied to one or both sides of the foil, at least one first metallic or barrier layer applied to the roughened layer, the metal in the first metallic layer being selected from the group consisting of indium, zinc, tin, nickel, cobalt, copper-zinc mixture or alloy and copper-tin mixture or alloy, and at least one second metallic or stabilization layer applied to the first metallic layer, the metal in the second metallic layer being selected from the group consisting of tin, chromium, and chromium-zinc mixture or alloy. In one embodiment, the foregoing combination of metallic layers is applied to one side of the foil (e.g., matte side), and the above-mentioned second metallic or stabilization layer is applied to the base foil on the other side (e.g., shiny side) of the foil.

A silane coupling agent can be applied over the one or both sides of the inventive foil or one of the above-mentioned metallic treatment layers. The silane coupling agent can be represented by the formula

wherein R is a functionally substituted hydrocarbon group, the functional substituent of said functionally substituted hydrocarbon group being amino, hydroxy, halo, mercapto, alkoxy, acyl, or epoxy; X is a hydrolyzable group, such as alkoxy (e.g., methoxy, ethoxy, etc.), or halogen (e.g., chlorine); and n is 1, 2 or 3, and preferably n is 3. The silane coupling agents represented by the above formula include halosilanes, aminoalkoxysilanes, aminophenylsilanes, phenylsilanes, heterocyclic silanes, N-heterocyclic silanes, acrylic silanes, mercapto silanes, and mixture of two or more thereof.

Useful silane coupling agents include those selected from the group consisting of aminopropyltrimethoxy silane, tetramethoxy silane, tetraethoxy silane, bis(2-hydroxyethyl)-3-aminopropyltriethoxy silane, 3-(N-styrylmethyl-2-aminoethylamine) propyltrimethoxy silane, 3-glycidoxypropyltrimethoxy silane, N-methylaminopropyltrimethoxy silane, 2-(2-aminoethyl-3-aminopropyl)trimethoxy silane, and N-phenylaminopropyltrimethoxy silane.

A useful silane coupling agent mixture is 3-glycidoxypropyltrimethoxy silane, and tetramethoxy silane or tetraethoxy silane. The weight ratio of the former to the latter can range from about 1:10 to about 10:1, and in one embodiment about 1:5 to about 5:1, and in one embodiment the weight ratio is about 4:1.

A useful silane coupling agent mixture is N-methylaminopropyltrimethoxy silane and chloropropyltrimethoxy silane. The weight ratio of the former to the latter can range from about 1:10 to about 10:1, and in one embodiment about 1:5 to about 5:1, and in one embodiment the weight ratio is about 1:1.

A useful silane coupling agent mixture is 3-(N-styrylmethyl-2-aminoethyl amino)propyltrimethoxy silane and N-methylaminopropyltrimethoxy silane. The weight ratio of the former to the latter can range from about 1:10 to about 10:1, and in one embodiment about 1:5 to about 5:1, and in one embodiment the weight ratio is about 1:1.

A useful silane coupling agent mixture is 3-glycidoxypropyltrimethoxy silane and N-methylaminopropyltrimethoxy silane. The weight ratio of the former to the latter can range from about 1:10 to about 10:1, and in one embodiment about 1:5 to about 5:1, and in one embodiment the weight ratio is about 1:3.

The coating of the foil surface with the silane coupling agent may be effected by applying the silane coupling agent alone to the surface of the foil. However, it is generally preferred that coating be effected by applying the silane coupling agent in a suitable medium to the foil surface. More specifically, the silane coupling agent can be applied to the foil surface in the form of a solution in water, a mixture of water and alcohol, or a suitable organic solvent, or as an aqueous emulsion of the silane coupling agent, or as an aqueous emulsion of a solution of the silane coupling agent in a suitable organic solvent. Conventional organic solvents may be used for the silane coupling agent and include, for example, alcohols, ethers, ketones, and mixtures of these with aliphatic or aromatic hydrocarbons or with amides such as N,N-dimethylformamide. Useful solvents are those having good wetting and drying properties and include, for example, water, ethanol, isopropanol, and methylethylketone. Aqueous emulsions of the silane coupling agent may be formed in conventional manner using conventional dispersants and surfactants, including non-ionic dispersants. It may be convenient to contact the metal surface with an aqueous emulsion of the silane coupling agent. The concentration of the silane coupling agent in such solutions or emulsions can be up to about 100% by weight of the silane coupling agent, and in one embodiment is in the range of about 0.1% to about 5% by weight, and in one embodiment about 0.3% to about 1% by weight. The process of coating with the silane coupling agent may be repeated, if desired, several times. The silane coupling agent may be applied to the foil surface using known application methods which include reverse roller coating, doctor blade coating, dipping, painting and spraying.

The application of the silane coupling agent to the foil surface is typically effected at a temperature of about 15° C. to about 45° C., and in one embodiment about 20° C. to about 30° C. Following application of the silane coupling agent to the foil surface, the silane coupling agent can be heated to a temperature of about 60° C. to about 170° C., and in one embodiment about 90° C. to 150° C., for generally about 0.1 to about 5 minutes, and in one embodiment about 0.2 to about 2 minutes to enhance drying of the surface. The dry film thickness of the silane coupling agent on the foil is generally from about 0.002 to about 0.1 micron, and in one embodiment about 0.005 to about 0.02 microns.

The layer of flexible polymeric material used with the inventive laminate is typically in the form of a thin film. In one embodiment, it is comprised of a thermosetting resin, thermoplastic resin, polyester resin, polyimide resin, condensation polymer, or mixture of two or more thereof. The layer of polymeric material can have any thickness that is desired so long as it remains sufficiently flexible for the desired end use. The layer of polymeric material can be comprised of a single layer or it can be multilayered. In one embodiment, the copper foil layer has a single or multilayered polymeric material layer overlying one side of the foil. In one embodiment, single or multilayered polymeric material layers overlie both sides of the foil layer. In one embodiment, each layer of polymeric material has a thickness in the range of about 0.0005 to about 0.03 inch, and in one embodiment about 0.001 to about 0.02 inch, and in one embodiment about 0.001 to about 0.01 inch, and in one embodiment about 0.001 to about 0.005 inch.

The thermosetting resins that can be used include phenolic resins, phenol-aldehyde resins, furan resins, aminoplast resins, alkyd resins, allyl resins, epoxy resins, epoxy prepregs, polyurethane resins, thermosetting polyester resins, polyimide bis-maleimide resins, polymaleimide-epoxy resins, polymaleimide-isocyanate resins, silicone resins, cyanate resins, cyanate-epoxy resins, cyanate-polymaleimide resins, cyanate-epoxy-polymaleimide resins, and the like.

The thermoplastic resins include poly alpha-olefins, polyethylene, polypropylene, poly 4-methyl-pentene-1, ethylene/vinyl copolymers, ethylene vinyl acetate copolymers, ethylene acrylic acid copolymers, ethylene methacrylate copolymers, ethylmethylacrylate copolymers, etc.; thermoplastic propylene polymers such as polypropylene, ethylene-propylene copolymers, etc.; vinyl chloride polymers and copolymers; vinylidene chloride polymers and copolymers; polyvinyl alcohols; acrylic polymers made from acrylic acid, methacrylic acid, methylacrylate, methacrylate, acrylamide, and the like; fluorocarbon resins such as polytetrafluoroethylene, polyvinylidiene fluoride, and fluorinated ethylenepropylene resins; styrene resins such as a polystyrene, alpha-methylstyrene, high impact polystyrene, acrylonitrilebutadiene-styrene polymers, and the like.

The polyester resins include those made from dibasic aliphatic and aromatic carboxylic acids and diols or triols. These include polyethylene terephthalate, polyethylene naphthalate, polybutylene terephthalate, and the like. The polycarbonates, which are long chained linear polyesters derived from carbonic acids (e.g., phosgene) and dihydric phenols (e.g., bisphenol A), can be used.

The polyimide resins can be made by a reaction involving contacting a tetrabasic acid dianhydride with an aromatic diamine giving first a polyamic acid which is then converted by heat or catalyst into a high molecular weight linear polyimide.

The condensation polymers that are useful include the polyamides, polyetherimides, polysulfones, polyethersulfones, polybenzazoles, aromatic polysulfones, polyphenylene oxides, polyether ether ketones, and the like.

The polymeric film materials that are useful include polyester film materials such as polyethylene terephthalates and polybutylene terephthalates, and the polyimides. These film materials are sold by DuPont, Allied-Apical, Teijin, Kanega-fuchi and Ube Industries, under the tradenames Mylar®, Kapton®, Apical® and Upilex®.

In one embodiment, the copper foil layer is adhered to the layer of polymeric material using adhesiveless techniques. The side of the layer of polymeric material to which the copper foil is to be adhered is treated with a seed coat layer of copper. The seed coat layer of copper is deposited on the layer of polymeric material using vapor deposition techniques well known in the art. The thickness of the seed coat layer can be in the range of about 100 to about 20,000 angstroms. The layer of copper foil is then electrodeposited on to the seed coat layer under the conditions disclosed above using known techniques.

In one embodiment, the side of the layer of polymeric material to which the copper foil is to be adhered is initially treated with plasma. The plasma is applied to the polymer surface for an effective period of time and at a sufficient level of intensity to chemically modify the surface, remove surface contaminates and/or enhance surface roughness. The plasma-treated surface then has a nickel tie coat layer adhered to it. The nickel tie coat layer is comprised of nickel or a nickel-based alloy. The alloying metal is selected from the group consisting of Cu, Cr, Fe, V, Ti, Al, Si, Pd, Ta, W, Zn, In, Sn, Mn, Co and mixtures of two or more thereof. The nickel tie coat layer has a thickness in the range of about 30 to about 500 angstroms, and in one embodiment about 50 to about 300 angstroms. The nickel tie coat layer can be in the form of a continuous or a discontinuous layer. The nickel tie coat layer has a copper seed coat layer adhered to it. The copper seed coat layer has a thickness of about 200 to about 20000 angstroms, and in one embodiment from about 1200 to about 5000 angstroms. The tie coat layer and the copper seed coat layer can be applied using known vapor deposition techniques. The layer of copper foil is electrodeposited onto the copper seed coat layer under the conditions disclosed above using known techniques.

Adhesive based flexible laminates within the scope of the invention are prepared by adhering the layer of polymeric material to the copper foil layer using an adhesive. The adhesive can be any epoxy, acrylic, polyimide, phenolic butyral, polyester, or Teflon combination, known in the art. The adhesive is preferably in the form of liquid. The adhesive is applied to either a side of the layer of polymeric material and/or to a side of the layer of copper foil. In one embodiment, the adhesive has a surface tension that is lower than the surface tension of either the polymeric material layer or the copper foil layer. After the layers of polymer and/or foil have been coated with the adhesive, they are advanced through combining rolls or nip rollers, which use heat and/or pressure to bond the layers together. These techniques are well known in the art.

Once the copper layer is adhered to the layer of polymeric material, the desired circuit or wiring pattern can be formed using an etching process wherein a resist and etchant baths are used to selectively remove copper leaving the pattern. These techniques are well known in the art. Once the circuit or wiring pattern is formed, one or more layers of polymeric material can be adhered to the laminate over the etched wiring or circuit pattern using an adhesive.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

We claim:

1. A flexible laminate comprising a layer of electrodeposited copper foil overlying a layer of a flexible polymeric material, said copper foil being characterized by an ultimate tensile strength at 23° C. of at least about 60,000 psi, a loss of ultimate tensile strength at 23° C. of no more than about 15% after being annealed at 180° C. for 30 minutes, an average grain size of up to about 1 micron, and a fatigue performance characterized by at least about 5000 cycles to failure when the strain amplitude is about 0.05% to about 0.2%.

2. The laminate of claim 1, characterized in that the copper foil has an ultimate tensile strength at 23° C. in the range of about 60,000 to about 120,000 psi prior to being annealed.

3. The laminate of claim 1, characterized in that the copper foil exhibits a loss in ultimate tensile strength of not more than about 5% after being annealed at 180° C. for 30 minutes.

4. The laminate of claim 1, characterized in that the copper foil is electrodeposited using an electrolyte solution characterized by a chloride ion concentration of up to about 4 ppm and an organic additive concentration of at least about 0.3 ppm.

5. The laminate of claim 4, characterized in that the organic additive is a gelatin.

6. The laminate of claim 5, characterized in that the organic additive is an animal glue.

7. The laminate of claim 4, characterized in that the organic additive concentration is in the range from about 0.3 ppm to about 10 ppm.

8. The laminate of claim 4, characterized in that the chloride ion concentration is up to about 1 ppm.

9. The laminate of claim 1, wherein the fatigue performance of the copper foil is characterized by at least about 50,000 cycles to failure when the strain amplitude is about 0.05% to about 0.2%.

10. The laminate of claim 1, wherein the fatigue performance of the copper foil is characterized by at least about 500,000 cycles to failure when the strain amplitude is about 0.05% to about 0.2%.

11. The laminate of claim 1, characterized in that said copper foil has a matte side $R_{tm}$ in the range of about 1 to about 10 microns.

12. The laminate of claim 1, characterized in that said copper foil has a shiny side $R_{tm}$ that is less than about 6 microns.

13. The laminate of claim 1, characterized in that said copper foil has at least one roughened layer of copper applied to one or both sides of said foil.

14. The laminate of claim 1, characterized in that said copper foil has at least one metallic layer applied to one or both sides of said foil, the metal in said metallic layer being selected from the group consisting of indium, zinc, tin, nickel, cobalt, copper-zinc mixture, copper-tin mixture, and zinc-nickel mixture.

15. The laminate of claim 1, characterized in that said copper foil has at least one metallic layer applied to one or both sides of said foil, the metal in said metallic layer being selected from the group consisting of tin, chromium, chromium-zinc mixture, zinc, and zinc-nickel mixture.

16. The laminate of claim 1, characterized in that said copper foil has at least one roughened layer of copper applied to one or both sides of said foil, at least one first metallic layer applied to said roughened layer, the metal in said first metallic layer being selected from the group consisting of indium, zinc, tin, nickel, cobalt, copper-zinc mixture, copper-tin mixture, and zinc-nickel mixture, and at least one second metallic layer applied to said first metallic layer, the metal in said second metallic layer being selected from the group consisting of tin, chromium, chromium-zinc mixture, zinc, and zinc-nickel mixture.

17. The laminate of claim 1, characterized in that said copper foil has at least one silane coupling agent overlying one or both sides of said foil.

18. The laminate of claim 1, characterized in that the polymeric material is comprised of a thermosetting resin, thermoplastic resin, condensation polymer, or mixture of two or more thereof.

19. The laminate of claim 1, characterized in that the polymeric material is comprised of polyimide or polyester.

20. The laminate of claim 1, characterized in that the layer of copper foil is adhered to the layer of polymeric material by an adhesive.

21. The laminate of claim 20, characterized in that the adhesive is an epoxy, acrylic, polyimide, phenolic butyral or polyester.

22. The laminate of claim 1, characterized in that the layer of copper foil is adhered to the layer of polymeric material using an adhesiveless technique.

23. The laminate of claim 22, characterized in that a copper seed coat layer is positioned between the layer of copper foil and the layer of polymeric material.

24. The laminate of claim 1, characterized in that the layer of copper foil is in the form of an etched pattern.

25. A flexible laminate comprising a layer of electrodeposited copper foil overlying a layer of a flexible polymeric material, said copper foil being characterized by an ultimate tensile strength at 23° C. of about 90,000 psi to about 105,000 psi, a loss of ultimate tensile strength at 23° C. of no more than about 8% after being annealed at 180° C. for 30 minutes, an average grain size of about 0.1 to about 0.5 micron, and a fatigue performance characterized by at least about 100,000 cycles to failure when the strain amplitude is about 0.05% to about 0.2%.

26. The laminate of claim 25, characterized in that the copper foil is electrodeposited using an electrolyte solution characterized by a chloride ion concentration of up to about 1 ppm and an animal glue concentration of about 2 to about 4 ppm.

* * * * *